United States Patent [19]

Coutures

[11] Patent Number: 4,885,626
[45] Date of Patent: Dec. 5, 1989

[54] CHARGE-READING DEVICE FOR LINEAR PHOTOSENSOR WITH LINE STRUCTURE ANTI-DAZZLE DEVICE

[75] Inventor: Jean-Louis Coutures, St-Egreve, France

[73] Assignee: Thomson-CSF, Paris, France

[21] Appl. No.: 308,454

[22] Filed: Feb. 10, 1989

[30] Foreign Application Priority Data

Feb. 12, 1988 [FR] France ............................. 88 01683

[51] Int. Cl.⁴ ..................... G11C 19/28; H01L 29/78; H01L 27/14; H04N 3/14
[52] U.S. Cl. ........................................ 377/58; 357/24; 357/30; 358/213.19
[58] Field of Search ................ 357/24, 30; 377/57–63; 358/213.19, 213.26

[56] References Cited

U.S. PATENT DOCUMENTS

| | | | |
|---|---|---|---|
| 4,169,273 | 9/1979 | Hendrickson | 357/24 |
| 4,242,599 | 12/1980 | Suzuki | 357/24 |
| 4,644,572 | 2/1987 | Lambeth | 357/24 |

FOREIGN PATENT DOCUMENTS 2125650  3/1984  United Kingdom .

OTHER PUBLICATIONS

Solid State Technology, vol. 19, no. 9, Sep. 1976, pp. 83–86; D. D. Wen, et al.

Primary Examiner—Gene M. Munson
Attorney, Agent, or Firm—Oblon, Spivak, McClelland, Maier & Neustadt

[57] ABSTRACT

A charge transfer device for a linear photosensor is disclosed. It is necessary to provide for anti-dazzle devices to prevent charges, generated in excessive quantity by the photosensor, from saturating the read shift register. To prevent excess charges from being introduced into the register during the transfer between a storage gate and the register, and to enable a juxtaposition, with a small pitch, of the read elements of each photodiode of the reading device, a structure is proposed with an input diode De, and on a first side of the diode, an input gate, a storage gate and the gate for transfer to the shift register; these three elements are standard ones; on the other side, three successive gates, the first one being adjacent to a charge removal region. The potential imposed on the first of these three gates is greater than the potential imposed on the input gate of the other side of the diode.

3 Claims, 3 Drawing Sheets

SECTION B-B'

SECTION A-A'

SECTION B-B'

(durée Ti)

CHARGE-READING DEVICE FOR LINEAR PHOTOSENSOR WITH LINE STRUCTURE ANTI-DAZZLE DEVICE

BACKGROUND OF THE INVENTION

1. Field of the Invention

The present invention concerns photosensitive semiconductor devices and, more precisely, photosensitive linear strips consisting of a row of photodiodes coupled to a charge transfer reading device.

More precisely, the invention concerns the structure of the charge transfer reading device and the means that are associated with this device, to prevent the saturation of the reading device when there is a high degree of illumination of the strips.

FIG. 1 shows a top view of a possible way in which this reading device is constituted, for one of the photodiodes of the strip. FIG. 2 shows a section along the line AA' of FIG. 1.

The photodiode is not shown. Besides, it does not necessarily form part of the same semiconducting substrate as the reading device. It is connected, through an input conductor E, to the cathode CDe of an input diode De of the reading device. The cathode is an N type semiconducting region diffused in the P type semiconducting substrate in which the reading substrate is made.

An input gate Ge, insulated from the substrate by a thin insulating film, covers a P type substrate region 10 which is immediately adjacent to the cathode of the input diode De. This gate is carried to a constant potential Ve and enables the potential of the diode De to be fixed at a value Vo.

A storage gate Gs, also insulated from the substrate, covers a P type substrate region 12 which is immediately adjacent to the region 10. This gate is carried to a fixed potential Vs and enables the storage of the charges coming from the photodiode, as and when they arrive from this diode, because of the exposure of the photodiode to light. The potential of the substrate beneath the gate Gs, where there are no stored charges, is V1.

A passage gate Gp, insulated from the substrate, covers a substrate region 14, immediately adjacent to the region 12. This gate enables the insulation of the charge storage zone (beneath the gate Gs) during the illumination and, periodically, at the end of an illumination measurement period, it is carried to a potential which is high enough to transfer the stored charges to a charge transfer shift register. This register will work during the intervals between these periodic transfers to transmit a item of information on illumination received by the photodiode. The shift register transfers the information while a new illumination period generates new charges beneath the storage gate Gs.

The shift register is depicated schematically by a gate electrode Gccd, controlled by a control phase Øccd at the register's own working frequency. This electrode is adjacent to the passage gate Gp.

To avoid problems related to dazzle, namely the generation of excessively high quantities of charges during the illumination measurement period, when the illumination is too intense, there is further provided a charge removal gate Gae on top of a P type substrate region 16 immediately adjacent, on one side, to the storage region 12 and, on the other side, to a charge removal region 18. This region is an N type region (a type opposite to that of the substrate) and is connected to a positive voltage source Vd.

The charge removal gate Gae is used in two ways: firstly, if it is known that the mean illumination during a period will be excessively high (for example, because this has been observed in the preceding period), the charges are prevented from collecting beneath the storage gate for a fraction of the measuring period. For this purpose, the potential barrier generated by the gate Gae and all the charges conveyed through the input E are immediately removed to the region 18. Then the collection of charges is permitted for the rest of the period; the fraction of a period corresponding to the systematic removal of the generated charges is chosen so that, on the whole, there is no risk of saturating the shift register; secondly, outside the charge removal period, during the integration period proper, if the illumination is, all the same, too intense despite and entails a risk of leading to a saturation of the shift register, it is seen to it that the surplus charges are automatically removed to the removal region 18. For this purpose, the potential of the removal gate Gae during the integration period is adjusted to a chosen value which defines the maximum quantity of charges which can be stored beneath the gate Gs. Beyond this value, the charges are shed or discharged into the region 18.

FIGS. 3 and 4, beneath FIG. 2, represents the potentials in the substrate beneath the different gates, firstly (FIG. 3) during the integration period proper (when the gate Gae is at a relatively low potential) and, secondly (FIG. 4) during the fraction of a period when no accumulation is permitted. In a standard way, the potentials have been shown to be increasing in the downward direction, and the accumulation or removal of charges is shown by hatched zones.

FIG. 5 shows, as a reminder, a timing diagram of the operating stages of the device. The gate Gae is carried to a high potential during a charge removal stage with a duration To. Then, during an integration stage, with a duration Ti, the gate Gae is carried to a relatively low potential defining the overflow threshold for the stored charges. At the end of the period or duration Ti, before a new period To, the passage gate Gp is briefly opened for a duration T1 and then shut again.

The approach that has just been described, for the making of charge reading devices with the removal of the overflow of charges and a possibility of setting up an integration period which is variable with the charges conveyed, has two types of drawbacks. The first is the fact that the charge removal region (18) and the gate Gae between this region 18 and the storage region 12 should be placed on a third side of the region 12, a first side being occupied by the input gate Ge while a second side is occupied by the passage gate Gp. If it is sought to make a reading device with many elements side by side, each element corresponding to a respective photodiode, the pitch between adjacent elements will be increased by the presence of the gate Gae and the region 18 on the third side of the gate 12, as well as the connections that convey the control signals to this gate and this region.

The second drawback is the fact that the anti-dazzle effect does not occur during the period T1 when the charges are transferred from the storage gate t the reading shift register. If the period T1 is not negligible as compared with the effective integration period Ti, and if the illumination is very intense during the period T1, a corresponding charge will be introduced into the shift register during the transfer period T1, and this charge could be enough to saturate the register despite the presence of the whole anti-dazzle system.

To overcome the drawbacks of the above-described technique, the present invention proposes a new structure of a charge reading device for linear photosensors comprising an anti-dazzle device.

SUMMARY OF THE INVENTION

The reading device comprises a input diode, a charge storage gate covering a charge storage region, an input gate covering an input region interposed between a first side of the input diode and the charge storage region, and a passage gate covering a region adjacent to the charge storage region and separating this region from a charge transfer reading register; according to the invention, there is provision for a first substrate region covered by a first gate carried to a constant potential, such that the potential in the first region, when there are no charges, is greater than the potential in the input region when there are no charges, the first region being adjacent to a second side of the input diode, opposite the first side, a second substrate region adjacent to the first region and covered by at least one second gate, and a charge removal region adjacent to the first substrate region, the second gate being carried to potentials that vary cyclically according to two stages, namely: a removal stage wherein the potential imposed by the second gate in the second region is greater than the potential of the first region, an integration stage wherein the potential imposed by the second gate in the second region is lower than the potential of the first region, and lower than the potential in the input region, the potential of the passage gate being carried to a high value for a short instant beginning after the start of the removal stage, said potential being kept at a low value throughput the integration stage.

With this structure, it is now possible to achieve a removal of charges, either to shed an overflow of charges or to control the effective integration time or period, without using the third side of the storage gate as was the case with the arrangement described with reference to to FIG. 1.

Furthermore, since the charges that have accumulated beneath the storage gate can now be transferred to the reading register outside the effective integration time, it will be show that the previously mentioned risk of the register being saturated by over-illumination during the transfer time no longer exists.

In a preferred embodiment, the device has a third gate covering a second region formed by a portion of the first region, the third region being adjacent to the removal region. The potential of the third gates varies cyclically according to the two operating stages of the device, and the potential generated when there are no charges beneath the second gate during the removal stage is greater than the potential generated beneath the third gate.

BRIEF DESCRIPTION OF THE DRAWINGS

Other features and advantages of the invention will appear from the following detailed description, made with reference to the appended drawings, of which.

DESCRIPTION OF A PREFERRED EMBODIMENT

Figure 6:
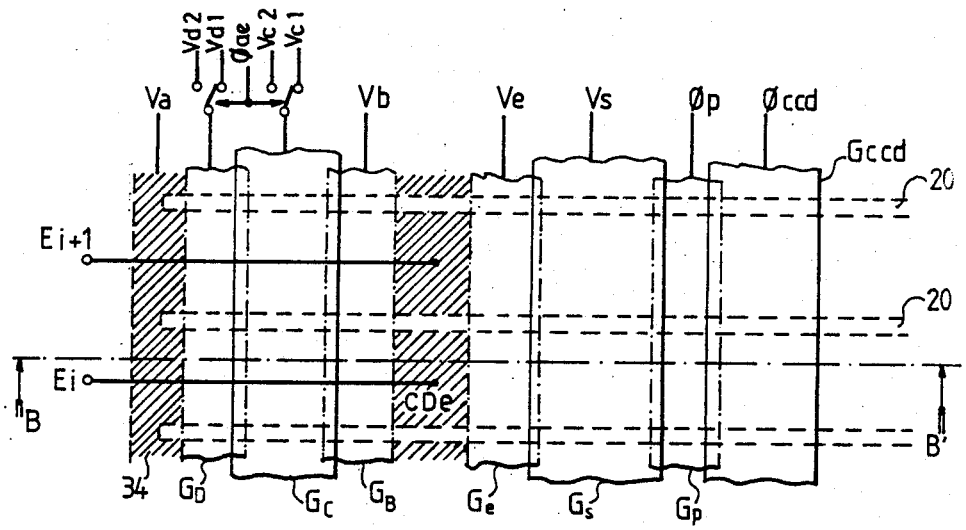
FIG. 6 shows a top view of a reading device according to the present invention.

FIG. 6 shows a top view of two juxtaposed elements of the reading device according to the invention. Each element corresponds to the reading of the charges generated by a respective photodiode of the linear photosensor, and two elements have been shown to give a clear view of how an entire line of reading elements can be arranged side by side, evenly and with as small a pitch as possible.

The reading elements are insulated from one another by any means which may be, for example, a relatively thick insulating zone that extends along two elements to be separated. Zones of this type are represented by the dashes 20 in FIG. 6.

This insulation is made to mutually separate the semiconductor substrate zones which are close to one another but correspond t different reading elements. However, it is not necessary to make an insulation between two gates corresponding t different reading elements if these gates have to be connected, at each instant, to one and the same constant or variable potential. This is why it will be seen that the gates of the reading device according to the invention all extend perpendicularly to the insulation zones 20 and cover corresponding regions of all the juxtaposed reading elements. For example, the storage gate, which plays the role explained with reference to FIGS. 1 to 5 is, a single gate which covers substrate regions that are insulated from one another by zones 20.

We shall now describe the constitution of an order i reading element, the structure of the neighbouring order i−1 element and order i+1 element being exactly the same and being covered by the gates which cover the order i elements.

The description will be made with reference to FIG. 6, which gives a top view, and FIG. 7 which is a cross-section along the length of the order i reading element (section along the line BB' of FIG. 6).

The order i reading element comprises an input $E_i$ connected to a respective, order i, elementary, photosensitive cell (photodiode) of the linear photosensor for which it is sought to measure the output signal.

The photosensitive cells are not shown and, besides, do not necessarily form part of the same semiconductor substrate as the reading device, especially if the detector concerned is one working in infrared mode, because it is then necessary to use different substrates for the photosensor and the reading device.

The input $E_i$ is connected to the cathode $CD_e$ of an input diode $D_e$. This diode has been given the same reference as FIG. 1, because it plays the same role.

The cathode of the diode is an N type region, diffused superficially in the semiconductor substrate which is preferably of the P type. The P and N doping can be reversed provided that the signs of the potentials are also reversed.

The input diode is adjacent, by a first side, to a P type region 22 covered with an input gate Ge carried to a fixed potential Ve. The function of the input gate Ge is to keep the potential of the region 22 at a fixed value Vo.

Figure 1:
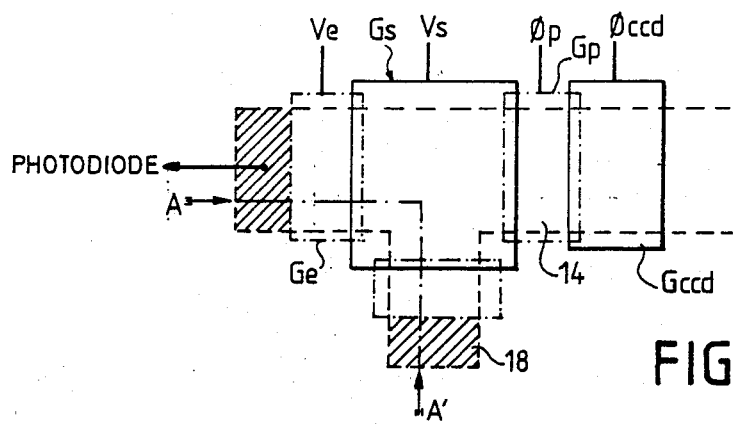
FIGS. 1 to 5, already described, enable an understanding of the working of a charge reading device with a standard anti-dazzle device.
Figure 2:
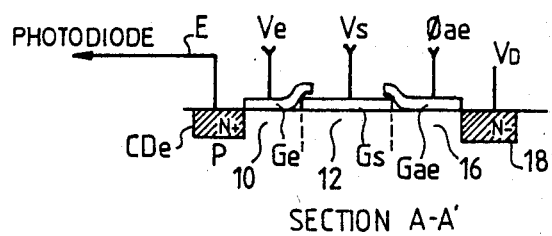
Figure 3:
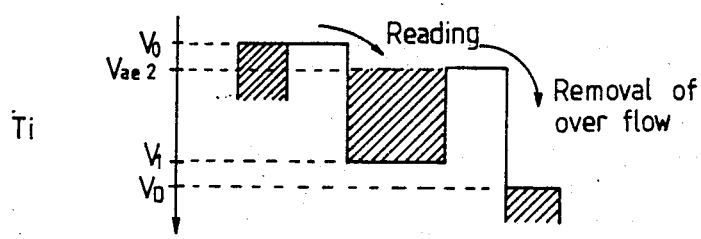
Figure 4:
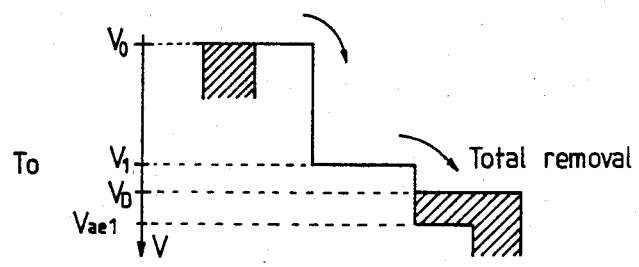
Figure 5:
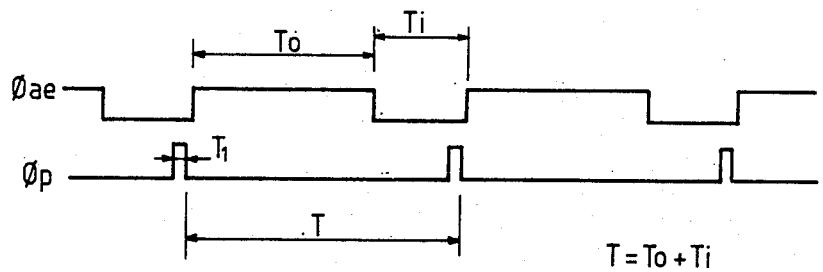

Just as in FIG. 1, there is then a charge storage region 24, adjacent to the region 22 and covered with a storage gate Gs carried to a fixed potential Vs.

There is then provided a region 26, which is adjacent to the region 24 and is covered with a passage gate Gp controlled by a phase Op so that, during the top state of $\phi p$, the potential of the gate Gp is raised to a value which enables the transfer of all the charges stored beneath the storage gate towards a shift register. This register is shown schematically in FIGS. 6 and 7 by an electrode. gate Gccd controlled by a stage $\phi ccd$. The regions 22, 24, 26 of the semiconductor substrate are located, as can be seen in FIGS. 6 and 7, on a first side of the input diode De, the region 24 being further away than the region 22 and the region 26 being further away than the region 24. On the other side of the input diode, at the left-hand side of FIGS. 6 and 7, there is a succession of three gates covering successive P type regions of the substrate.

The first gate Gb covers a region 28 which is immediately adjacent to the input diode. This first gate Gb is carried to a constant potential Vb such that the potential of the region 28, when there are no charges stored in this region, have a value V1 which is close to the potential Vo of the region 22 located beneath the input Ge, and is preferably greater than this potential.

The second gate Gc covers a region 30 adjacent to the region 28, and it is connected to a potential that varies cyclically according to two stages. In a first stage, the potential Vc1, applied to the second gate Gc, is relatively high and induces a potential B3 beneath this gate which is appreciably higher than the potential V1 beneath the first gate Gp, so that all the charges which could be stored beneath the first gate get shed or discharged beneath the second one. We shall return further below to the role of this shedding or discharging process. In a second stage, the potential Vc2, applied to the second gate, is relatively low, and is such that the potential of the region 30 is smaller not only than the potential V1 but also the potential Vo beneath the input gate of the other side of the input diode Ve.

The third gate Gd covers a region 32 which is adjacent to the region 30 and it is connected to a voltage source that varies in phase with the control of the second gate. The potentials VD1 VD2, applied to the third gate, are such that the potential of the regions 32 is always smaller than the potential in the region 30. In the first stage, the potential of the region 32 is given a high value V2 between V1 and V3. In a second stage, it is given a low value VL which is smaller than the potential of the region 30 and, therefore, also smaller than the potential Vo beneath the input gate and greater than the potential Vp beneath the gate Vp beneath the gate Gp during the same stage.

Figure 7:
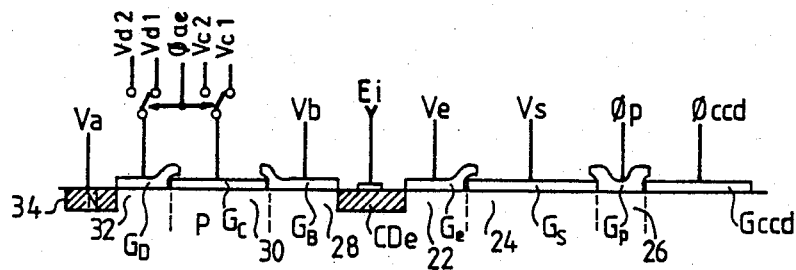
FIG. 7 shows a cross-section of the structure of FIG. 6.

Finally, FIGS. 6 and 7 also show a charge removal region 34 in the form of an N type region diffused in the substrate P. This region is adjacent to the region 32 covered by the third gate. It is carried to a relatively high potential Va, which may be constant and which, during the first stage, should be greater than the potential V2 beneath the third gate Gd.

Figure 8:
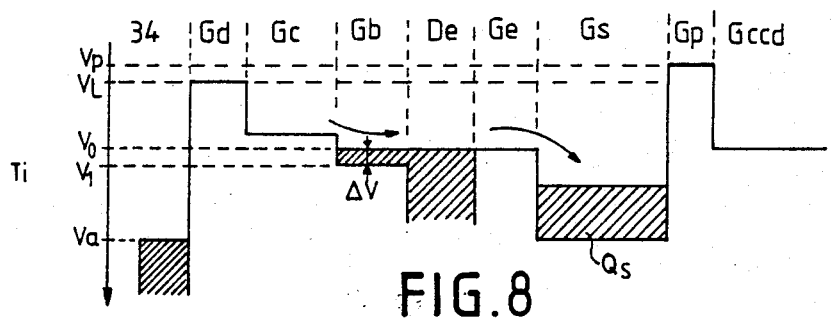
FIG. 8 shows a graph of the potentials in the semiconductor substrate during a stage for the effective integration of the charges generated by the photosensor.
Figure 9:
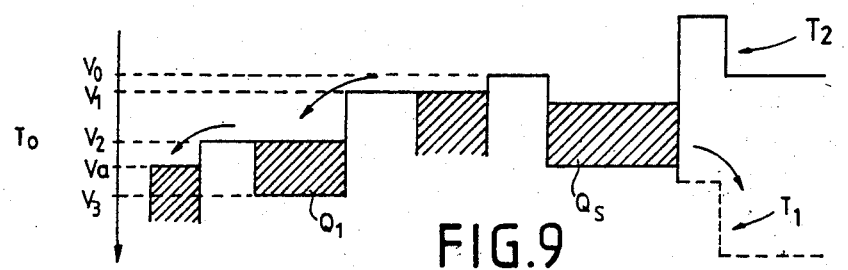
FIG. 9 shows a graph of the potentials in the substrate during a stage for the systematic removal of the generated charges.
Figure 10:
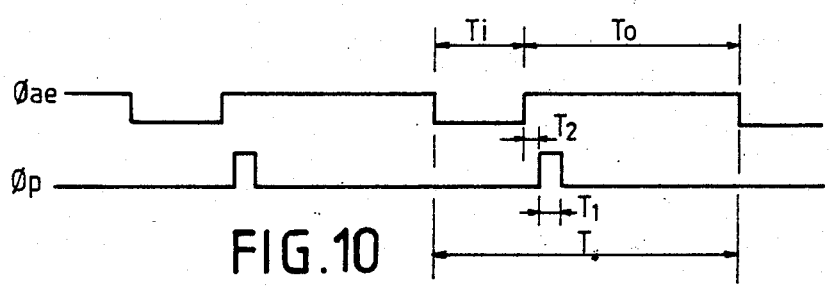
FIG. 10 shows a timing diagram of the relative stages for the application of chosen potentials to the gates of the reading device.

Referring to FIGS. 8, 9, and 10, we shall now describe the working of this reading device.

As in the device of FIG. 1, the operation takes place in a first stage for the systematic removal of the charges conveyed to the input to prevent the storage of these charges beneath the gate Gs, and a second integration stage, during which the accumulation of charges beneath the gate Gs is allowed. The first stage lasts for a period To which may be a variable fraction of the period T of the operation of the device. The second stage occupies the rest Te of the period T. In the figures, a periodic logic signal $\phi ae$ defines these two stages at each period. The shedding or discharging, into the shift register, of the charges stored beneath the gate takes place for a short instant, with a duration T1, at each period T. The duration T1 starts after a slight delay T2 depending on the start of the removal stage To. The discharge is controlled by the passage gate Gp, with a logic signal $\phi p$ defining the delay T2 and the duration T1. The logic signals $\phi ae$ and $\phi p$, are recalled in FIG. 10.

FIG. 8 shows a graph of potentials in the substrate beneath the different elements (gates and diodes) of FIG. 7, during the stage for the integration of charges received from the photodiode, assuming that there is no over-illumination warranting a removal of an overflow of charges.

The maximum potential permitted beneath the input diode and beneath the first gate Gb is the potential Vo. As soon as this potential is exceeded, as a consequence of the accumulation of charges coming from the input Ei (and it will be seen that this occurs very quickly after, or even instantaneously with, the start of the period Ti), the charges arising from the input are discharged towards the region 24 beneath the storage gate Gs. They collect beneath the gate, and make the potential of the region 24 come down in proportion to the quantity of the charges Qs that have arrived. It will be assumed, firstly, that, given the potential Vs applied to the storage gate and the normal quantity of charges that have arrived during the period Ti, the potential of the storage 24 does not fall below Vo. Besides, the potential Vo defines the dazzle threshold: if the quantity of charges that have arrived in the duration Ti makes the potential fall below Vo, it is considered that there are too many charges, and that the surplus should be removed so that there is no risk of saturation of the shift register. The way in which this removal takes place shall be seen further below. The result, therefore, at the end of the duration Ti, is the configuration of potentials of FIG. 8. It is necessary to take note, in this figure, of the charges, stored both in the input diode De and beneath the first gate, which have collected at the very start of the period Ti and will get emptied into a potential well beneath the second gate Gc at the very beginning of the removal stage which follows the end of the integration stage.

The configuration of potentials during the removal stage To is shown in FIG. 9.

The charges that collect beneath the potential well and in the input diode De get emptied into the potential well formed beneath the second gate Gc in the region 30 (for which the initial potential, when there are no charges, is V3, higher than the potentials V2 and V1 of the regions 32 and 28 which are on either side of it). If the quantity of the transferred charges Qo is greater than this well can contain, then the surplus gets emptied in the removal region 34. The potential well beneath the gate forms a reserve of charges which will be repositioned beneath the first gate Gb and the input diode De at the start of the following integration stage.

In principle, the storage capacity Q1 of the potential well beneath the second gate will be chosen to be smaller than the quantity of charges Qo stored between the potentials Vo and V1 beneath the first gate and in the input diode, i.e. smaller than the product of the difference V1 − Vo by the sum of the capacities of the first gate and the diode. However, in certain applications, it may be considered that it will be equal to or greater than this product.

During the period T2, the charges Qs stored beneath the storage gate Gs remain confined in the potential wells created beneath this gate. Then the passage gate Gp is taken, during the period T1, to a high potential which enables the transfer of the entire quantity of charges Qs to the shift register.

Throughout the rest of the duration To, the configuration of potentials of FIG. 9 remains unchanged, and all the charges brought by the input Ei are shed as and when they arrive at the region 28, from where they go into the region 30. However, since the potential well of the region 30 is full from the very start of the duration To, the additional charges immediately get shed into the removal region 34. Of the two potential barriers surrounding the well, the barrier is indeed lower on the third gate side.

Consequently, the structure of FIG. 6 clearly enables total removal of charges during a selected fraction of the working period of the device.

We shall now show what happens when there is an excessively intense illumination, leading to excessive accumulation of the charges coming from the photodiode. As already stated, the threshold of the quantity of charges that can be admitted may be regulated by the choice by the storage capacity of the region 24 beneath the gate Gs. This capacity depends essentially on the area of the gate and the difference between the potential Vo and the potential imposed by the voltage Vs in a region 24 when it is empty of charges.

During the integration stage (FIG. 11), if the charges get collected beyond the storage capacity of the potential well beneath the storage gate Gs, then these charges flow over into the input diode and beneath the first gate Gb. If the accumulation continues, they also flow over and come beneath the gate Gc. It can even be imagined that they continue beyond the storage capacities, between the potential barriers formed, on the one hand, beneath the third gate Gc and, on the other hand, beneath the passage gate Gp. But then it must be imperatively seen to it that the potential barrier beneath the passage gate is higher than beneath the gate Gd. In this case, in the event of excessive accumulation, the excess charges will ultimately get shed into the removal region 34.

Figure 11:
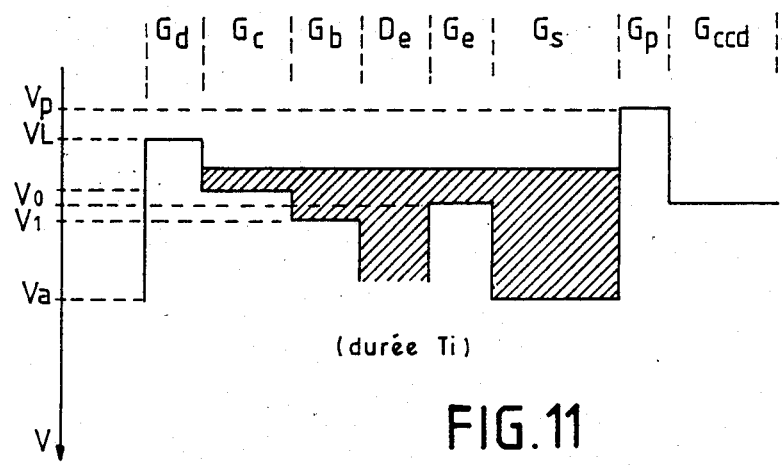
FIG. 11 shows a graph of potentials during the integration stage in the presence of an over-illumination.

FIG. 11 shows a more probable example, wherein the excessive accumulation of charges causes an overflow going up to the second gate Gc but no further.

At the moment when the integration Ti ends, the potential barriers beneath the second and third gates are simultaneously lowered so that all the excess charges are emptied into the removal region 34 and so that only charges in the potential wells remain, as shown in FIG. 9, i.e. charges entirely filling the well created beneath the storage gate Gs, and charges filling the well beneath the second gate Gc. Only the charges beneath the storage gate will be shed a little later, during the period T1 and the dazzle threshold will not be exceeded.

An important point to which we must return is the recovery of the charge Q1 stored during the removal stage (FIG. 9) beneath the second gate Gc. When a new integration period Ti begins, the potentials of the second and third gates fall simultaneously and the potential of the second gate stays higher than that of the third, and the charge Q1 is shed towards the first gate Gb.

In principle, this charge Q1 is smaller than the charge Qo which may be stored between the potentials Vo and V1 in the diode De and beneath the first gate Gb. This means that:

at the instant when the duration Ti begins, the potential of the input diode and that of the region 28 beneath the first gate falls to an intermediate value between V1 and Vo, during the start of the duration Ti, the first charges coming from the input Ei will serve to bring down the potential of the input diode to Vo, and it is only after the arrival of a certain well-determined quantity of charges, that the charges coming from the input can be directed to the storage gate Gs.

This device is particularly valuable because, through an appropriate choice of the storage capacity beneath the gate Gc (depending on its area and on the difference in potential V3 − V2), it makes it possible to compensate for the introduction, at the input Ei, of stray charges which might not be generated by the illumination which it is sought to measure.

Notably, it is known that photodiodes generate a certain current called a "dark current", even when they are not illuminated. The bias current of the photodiodes also generate charges. The presence of the charge Q1 enables this current to be compensated for in a computable way. It is also quite possible to envisage a situation where the difference in potential V3 − V2 will be automatically linked to an operating parameter of the device, notably during the period Ti since the effects of the dark current or any unwanted DC component on the charge Qs will be proportionate to the duration Ti.

In conclusion, it may be recalled that, with the structure according to the invention, the charge restored Qs can be transferred to the shift register after the start of the removal stage, so that a high degree of over-illumination during the T1 transfer period will not carry excess charges to the register. On the contrary they will be directly removed to the region 34.

In an alternative embodiment, the third gate Gt is eliminated and a second Gc covers a second region grouping the regions 30 and 32, the dopings of the substrate being different in the regions 30 and 32 so as to impose different potentials V2 and V3 for a single potential applied to the gate Gc.

What is claimed is:

1. A charge-reading device for a linear photosensor, comprising a semiconductor substrate, an input diode, a charge storage gate covering a charge storage region, an input gate covering an input region interposed between a first side of the input diode and the charge storage region, and a passage gate covering a region adjacent to the charge storage region and separating this region from a charge transfer reading register, wherein there is provision for a first substrate region covered by a first gate carried to a constant potential, such that the potential (V1) in the first region, when there are no charges, is greater than the potential (Vo) in the input region when there are no charges, the first region being adjacent to a second side of the input diode, opposite the first side, a second substrate region adjacent to the first region and covered by at least one second gate, and a charge removal region adjacent to the first substrate region, the second gate being carried to potentials that vary cyclically according to two stages, namely:

a removal stage wherein the potential imposed by the second gate in the second region is greater than the potential of the first region, an integration stage wherein the potential imposed by the second gate in the second region is lower than the potential of the first region, and lower than the potential in the input region, the potential of the passage gate being carried to a high value for a short instant beginning after the start of the removal stage, and this potential being kept at a low value throughput the integration stage.

2. A reading device according to claim 1, comprising a third gate above a third region, formed by a portion of the second region, adjacent to the removal region, the third gate being carried to a potential that varies cyclically according to the two stages of operation of the device, in such a way that the potential (V3) which would be generated beneath the second gate, when there are no charges, during the removal stage, is greater than the potential (V2) beneath the third gate.

3. A device according to claim 2, wherein the potentials applied to the second and third gates during the removal stage define a charge storage well capable of storing a quantity of charges smaller than a quantity of charges Qo with $$Qo = (V1 = Vo)Cd$$

V1 and Vo being the potentials imposed when there are no charges beneath the first gate and beneath the input gate, respectively, at the integration stage, and Cd being the sum of the capacities of the diode and of the first gate.

* * * * *